(12) United States Patent
Yuda et al.

(10) Patent No.: US 10,419,121 B2
(45) Date of Patent: Sep. 17, 2019

(54) HEAT DISSIPATION DEVICE FOR OPTICAL TRANSCEIVER, AND OPTICAL COMMUNICATION DEVICE

(71) Applicant: SUMITOMO ELECTRIC INDUSTRIES, LTD., Osaka-shi, Osaka (JP)

(72) Inventors: Shuitsu Yuda, Osaka (JP); Naoya Kizaki, Osaka (JP); Yuichi Kitajima, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 1 day.

(21) Appl. No.: 15/735,652

(22) PCT Filed: Feb. 12, 2016

(86) PCT No.: PCT/JP2016/054152
§ 371 (c)(1),
(2) Date: Dec. 12, 2017

(87) PCT Pub. No.: WO2017/138152
PCT Pub. Date: Aug. 17, 2017

(65) Prior Publication Data
US 2018/0309519 A1    Oct. 25, 2018

(51) Int. Cl.
*H04B 10/40* (2013.01)
*H04B 1/036* (2006.01)
*H05K 7/20* (2006.01)

(52) U.S. Cl.
CPC ............ *H04B 10/40* (2013.01); *H04B 1/036* (2013.01); *H05K 7/20418* (2013.01)

(58) Field of Classification Search
CPC ...... H04B 10/40; H04B 1/036; H04B 10/071; H04B 10/0771; H04B 2210/078; H04B 10/032; H05K 7/20418
See application file for complete search history.

(56) References Cited

U.S. PATENT DOCUMENTS

| 6,816,376 | B2 | 11/2004 | Bright et al. |
| 6,980,437 | B2 | 12/2005 | Bright |

(Continued)

FOREIGN PATENT DOCUMENTS

JP    2010-85805 A    4/2010

OTHER PUBLICATIONS

FCM7133 10G Line Card Data Sheet <https://www.sumitomoelectric.com/cms/wp-content/uploads/2016/01/FCM7133_11_04_14_r2.2.pdf>, 1 page.

*Primary Examiner* — Ted M Wang
(74) *Attorney, Agent, or Firm* — Drinker Biddle & Reath LLP

(57) ABSTRACT

An optical communication device according to an embodiment of the present invention includes: a heat sink integrally having a plurality of contact portions respectively corresponding to the plurality of the optical transceivers, and a heat transfer portion bound to a casing so as to be able to transfer heat to the casing; a plurality of cage members configured to respectively accommodate the plurality of the optical transceivers, and having openings so as to allow the optical transceivers to be partially exposed to the contact portion side, respectively; a holding unit configured to hold the plurality of the cage members inside the casing in a state where the openings correspond to the contact portions, respectively; and an elastic member configured to bring the plurality of the optical transceivers into thermal contact with the plurality of the contact portions, respectively, by press- (Continued)

ing each of the plurality of the cage members toward the heat sink side.

9 Claims, 13 Drawing Sheets

(56) References Cited

U.S. PATENT DOCUMENTS

| | | | |
|---|---|---|---|
| 2005/0195565 A1* | 9/2005 | Bright | H04B 1/036 361/688 |
| 2014/0154912 A1* | 6/2014 | Hirschy | H01R 13/6595 439/487 |
| 2014/0286613 A1* | 9/2014 | Ito | G02B 6/4277 385/88 |

* cited by examiner (PRIOR ART)

HEAT DISSIPATION DEVICE FOR OPTICAL TRANSCEIVER, AND OPTICAL COMMUNICATION DEVICE

TECHNICAL FIELD

The present invention relates to a heat dissipation device for optical transceivers which dissipates heat generated from a plurality of optical transceivers, and relates to an optical communication device provided with the heat dissipation device.

More specifically, the present invention relates to a heat dissipation device for optical transceivers, and an optical communication device which adopt a mode of bringing a plurality of optical transceivers into thermal contact with one heat sink.

BACKGROUND ART

An optical transceiver is a key device necessary for transmission/reception of optical signals, and includes: a hollow body portion which has a circuit board having electronic components such as a light emitting element and a light receiving element mounted thereto; and a socket portion to which an optical connector is connected. Usually, the optical transceiver is a pluggable optical transceiver, and is inserted into/pulled out of a metal cage provided to a host board. The optical transceiver is electrically connected to a connector provided at a depth of the cage, and is latched while the optical transceiver is inserted in the cage.

PATENT LITERATURE 1 describes a heat dissipation device for an XFP-type optical transceiver adopted for a standard specification. As shown in FIG. 1 of PATENT LITERATURE 1, a metal cage having an insertion hole is installed at a surface of a host board, and an optical transceiver is inserted into/pulled out of the cage through the insertion hole provided in the cage. When the optical transceiver is inserted in the cage, a plug at the rear end of the optical transceiver is connected to a connector on the host board. Accordingly, transmission/reception of a communication signal is established between the optical transceiver and the host board, and power supply to the optical transceiver is performed.

PATENT LITERATURE 2 describes a heat dissipation device for optical transceivers in which device a plurality of cages are arrayed side by side with respect to one host board. FIG. 13 is a schematic diagram of a conventional heat dissipation device 100 described in PATENT LITERATURE 2.

As shown in FIG. 13, the heat dissipation device 100 includes: a plurality of cages 102 arrayed side by side on the surface of a host board 101; a plurality of heat sinks 104 respectively corresponding to openings 103 in the cages 102; and a common clip 105 which engages with side walls of the cages 102 located at both ends.

An optical transceiver 106 is inserted in each cage 102, and a heat sink 104 is in contact with the upper surface of the body portion of each optical transceiver 106. A spring member 107 is interposed between each heat sink 104 and the clip 105.

Each heat sink 104 is pressed toward the optical transceiver 106 side by the elastic force of a corresponding spring member 107, whereby the heat sink 104 comes into thermal contact with a corresponding optical transceiver 106 through the opening 103 in a corresponding cage 102.

CITATION LIST

Patent Literature

PATENT LITERATURE 1: U.S. Pat. No. 6,816,376
PATENT LITERATURE 2: U.S. Pat. No. 6,980,437

SUMMARY OF INVENTION

Technical Problem

The conventional heat dissipation device 100 adopts a mode in which one heat sink 104 is brought into thermal contact with one optical transceiver 106 (hereinafter, referred to as one-to-one correspondence mode).

Thus, for example, when it is desired to bring the heat sinks 104 into thermal contact with the inner surface of a casing 108 (see the imaginary lines in FIG. 13) in order to reduce the difference between the ambient temperature of the casing 108 and the operating temperature of the optical transceivers 106 in the casing 108 as much as possible, there are some cases where heat generated from the plurality of optical transceivers 106 cannot be appropriately transferred to the casing 108.

That is, with the one-to-one correspondence mode described above, as shown in FIG. 13, due to the difference in a height H1 in cross section of each optical transceiver 106, a height H2 at the upper end surface of each heat sink 104 with respect to the host board 101 varies in some cases.

Thus, the degree of close contact between the upper end surface of each heat sink 104 and the inner surface of the casing 108 varies, thus allowing air to be present between some heat sinks 104 and the casing 108, and as a result, heat generated from some optical transceivers 106 cannot be appropriately dissipated to the casing 108.

In view of the problem of the conventional art, an object of the present invention is to provide an optical communication device and a heat dissipation device for optical transceivers that can appropriately transfer, through a heat sink to a casing, heat generated from a plurality of optical transceivers.

Solution to Problem (1) An optical communication device according to one aspect of the present invention is an optical communication device having a casing accommodating a plurality of optical transceivers, the optical communication device including: a heat sink integrally having a plurality of contact portions respectively corresponding to the plurality of the optical transceivers, and a heat transfer portion bound to the casing so as to be able to transfer heat to the casing; a plurality of cage members configured to respectively accommodate the plurality of the optical transceivers, and having openings so as to allow the optical transceivers to be partially exposed to the contact portion side, respectively; a holding unit configured to hold the plurality of the cage members inside the casing in a state where the openings correspond to the contact portions, respectively; and an elastic member configured to bring the plurality of the optical transceivers into thermal contact with the plurality of the contact portions, respectively, by pressing each of the plurality of the cage members toward the heat sink side.

(11) A heat dissipation device according to one aspect of the present invention is a heat dissipation device for optical transceivers, the heat dissipation device configured to dissipate heat generated from a plurality of optical transceivers, the heat dissipation device including: a heat sink integrally having a plurality of contact portions respectively corresponding to the plurality of the optical transceivers, and a heat transfer portion bound to a casing of an optical communication device so as to be able to transfer heat to the casing; a plurality of cage members configured to respectively accommodate the plurality of the optical transceivers, and having openings so as to allow the optical transceivers to be partially exposed to the contact portion side, respectively; a holding unit configured to hold the plurality of the cage members inside the casing in a state where the openings correspond to the contact portions, respectively; and an elastic member configured to bring the plurality of the optical transceivers into thermal contact with the plurality of the contact portions, respectively, by pressing each of the plurality of the cage members toward the heat sink side.

Advantageous Effects of Invention

According to the present invention, heat generated from a plurality of optical transceivers can be appropriately transferred to a casing through a heat sink.

DESCRIPTION OF EMBODIMENTS

Figure 1:
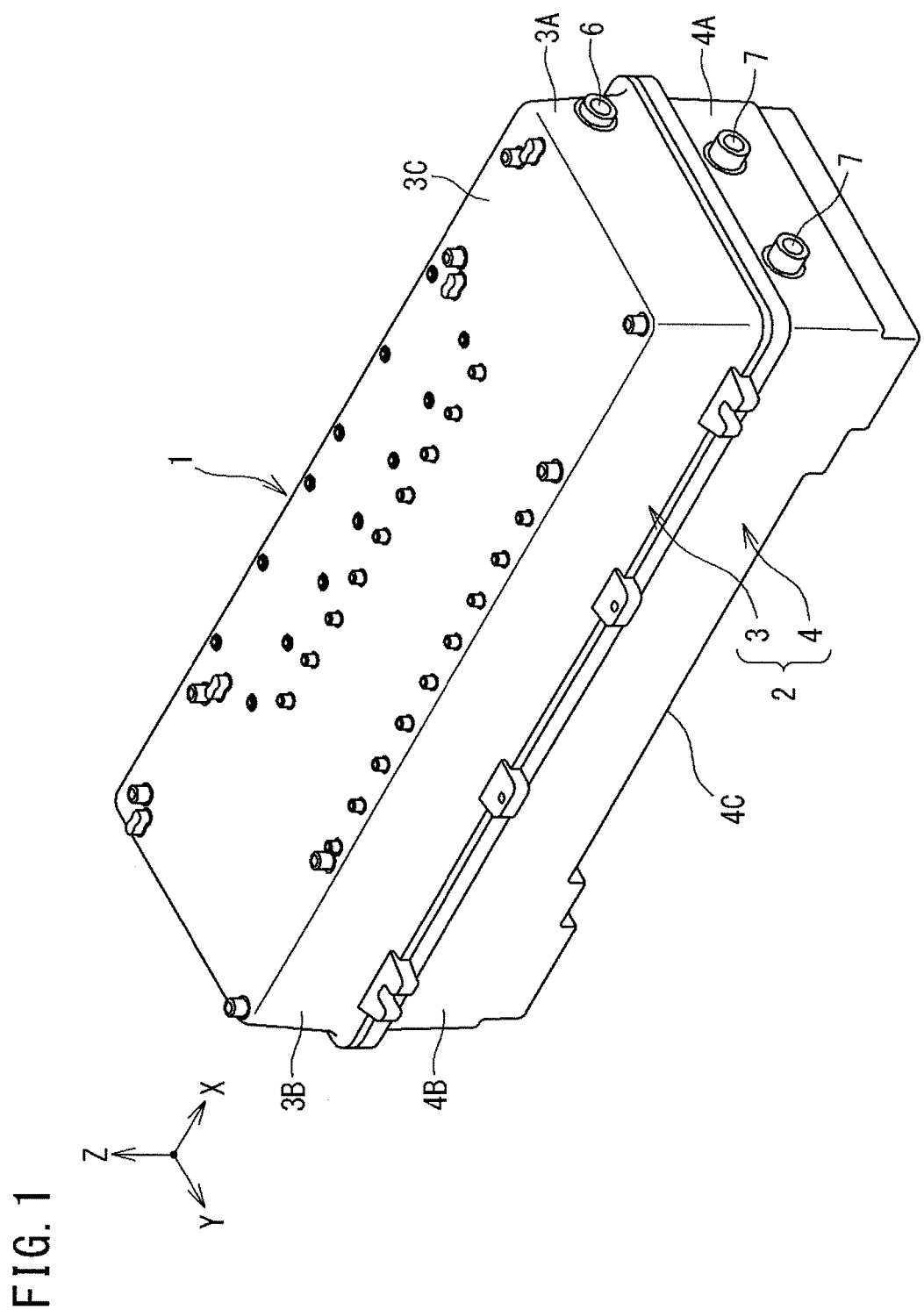
FIG. 1 is a perspective view of an optical communication device according to an embodiment of the present invention.

Outline of Embodiment of the Present Invention

Hereinafter, the outlines of embodiments of the present invention are listed and described.

(1) An optical communication device according to the present embodiment is an optical communication device having a casing accommodating a plurality of optical transceivers, the optical communication device including: a heat sink integrally having a plurality of contact portions respectively corresponding to the plurality of the optical transceivers, and a heat transfer portion bound to the casing so as to be able to transfer heat to the casing; a plurality of cage members configured to respectively accommodate the plurality of the optical transceivers, and having openings so as to allow the optical transceivers to be partially exposed to the contact portion side, respectively; a holding unit configured to hold the plurality of the cage members inside the casing in a state where the openings correspond to the contact portions, respectively; and an elastic member configured to bring the plurality of the optical transceivers into thermal contact with the plurality of the contact portions, respectively, by pressing each of the plurality of the cage members toward the heat sink side.

According to the optical communication device of the present embodiment, the elastic member brings the plurality of the optical transceivers into thermal contact with the plurality of the contact portions provided to the heat sink, respectively, by pressing each of the plurality of the cage members held in the holding unit toward the heat sink side.

Thus, since the present embodiment adopts a mode in which one heat sink is brought into thermal contact with a plurality of optical transceivers (hereinafter, referred to a one-to-many correspondence mode"), the difference in the height in cross section of the optical transceivers does not affect the heat transfer performance from the heat transfer portion of the heat sink to the casing side.

Accordingly, even if there is a difference in the height in cross section of the plurality of the optical transceivers, heat generated from the plurality of the optical transceivers can be appropriately transferred to the casing through the heat sink. Thus, in the optical communication device having the casing accommodating the plurality of the optical transceivers, the difference between the ambient temperature of the casing and the operating temperature of the optical transceivers in the casing can be reduced.

(2) Preferably, in the optical communication device of the present embodiment, the holding unit includes: a holding plate provided inside the casing such that a width direction of the holding plate is aligned with an arraying direction of the contact portions and an interval between the holding plate and each of the plurality of the contact portions is identical; and a positioning member configured to position the plurality of the cage members within the interval such that movement of each cage member in a width direction and a vertical direction with respect to the holding plate is restricted, and such that movement of each cage member in a thickness direction with respect to the holding plate is allowed.

(3) If the holding unit having the holding plate and the positioning member described above is adopted, a metal compression spring interposed between the holding plate and each cage member can be adopted as the elastic member.

Thus, compared with a case where a resin elastic member formed of a sponge, a rubber plate, or the like, aged deterioration of the elastic member can be suppressed, and the function of pressing the cage member by the elastic member can be ensured for a long time.

(4) In the optical communication device of the present embodiment, when the heat sink is a member separate from the casing, the heat transfer portion of the heat sink is formed as a portion to be in thermal contact with an inner surface of the casing.

(5) Preferably, when the above-described optical communication device adopts the heat sink formed as a member separate from the casing, the optical communication device further includes a pressing member configured to bring the heat transfer portion into thermal contact with the inner surface of the casing, by pressing the heat sink against the inner surface of the casing.

In this case, the heat transfer portion comes into thermal contact with the inner surface of the casing due to the pressing force of the pressing member, and thus, compared with a case where the heat transfer portion is brought into contact with the inner surface of the casing without application of the pressing force, the heat transfer performance from the heat transfer portion to the casing side can be improved.

(6) In the optical communication device of the present embodiment, when the heat sink is a member integrated with the casing, the heat transfer portion of the heat sink is formed as a portion made of a material identical to that of the casing, without any boundary surface between the heat transfer portion and the casing.

In this case, the heat transfer portion of the heat sink is formed as a portion made of a material identical to that of the casing, without any boundary surface between the heat transfer portion and the casing. Thus, compared with a case where the heat sink formed as a separate member is brought into contact with the inner surface of the casing, the heat transfer performance from the heat sink to the casing side can be improved.

(7) Preferably, in the optical communication device of the present embodiment, each cage member includes: a cage configured to accommodate one of the optical transceivers; and a host board having the single cage mounted to a surface thereof, for example.

(8) In addition, preferably, the optical communication device further includes: a main board including a circuit configured to perform information processing of an electric signal outputted by each optical transceiver; and a flexible cable including a first connector configured to be connected to the main board and a second connector configured to be connected to the host board.

In this case, the host board can be connected to the main board through the flexible cable by connecting the first connector to the main board and by connecting the second connector to the host board. Thus, arrangement of the cage members can be substantially freely designed regardless of the main board.

Therefore, for example, if the main board is disposed at the bottom side in the casing, and the holding unit holding the cage members is disposed at a side portion in the casing 2, the holding unit can be disposed in a compact manner at a place where the holding unit is less likely to be an obstruction in the casing, and thus, the accommodation space in the casing can be effectively utilized.

(9) Preferably, in the optical communication device of the present embodiment, the flexible cable is formed of a branched-type cable, the branched-type cable having the first connector and a plurality of the second connectors.

If the branched-type cable described above is adopted, the host boards of the plurality of the cage members can be wired to the main board simply by connecting the single first connector to the main board. Thus, the wiring work of the cage members is facilitated.

(10) Preferably, the optical communication device of the present embodiment is used in a place where ambient temperature (outside air temperature) of the casing is not higher than 60° C., for example.

The reason for this is considered as follows: in the optical communication device of the present embodiment, heat generated from the plurality of the optical transceivers is dissipated to the outside of the casing in a thermal route of the plurality of the optical transceivers→the heat sink→the casing; and thus, the difference between the temperature of the optical transceivers in the casing and the outside air temperature can be suppressed within 10° C., and the temperature does not exceed the upper limit (70° C.) of the operating temperature of the optical transceivers.

(11) A heat dissipation device of the present embodiment is a device configured to dissipate heat generated from a plurality of optical transceivers, and has substantially the same configuration as that of each of the optical communication devices according to (1) to (10) described above.

Thus, the heat dissipation device of the present embodiment exhibits effects similar to those of the optical communication devices according to (1) to (10) described above.

Details of Embodiments of the Present Invention

Hereinafter, details of embodiments of the present invention will be described with reference to the drawings. It should be noted that at least some parts of the embodiments described below may be combined together as desired.

Definition of Terms

In the present specification, "bringing" a member A and a member B "into thermal contact with" each other includes both of: bringing the contact surfaces of the member A and the member B into direct contact with each other; and indirectly joining the contact surfaces of the member A and the member B with a relatively thin member such as a thermally conductive sheet interposed therebetween, thereby filling the air gap between the contact surfaces.

As the thermally conductive sheet mentioned above, for example, it is possible to adopt a thin-film-shaped sheet material having high thermal conductivity, such as a resin sheet having low hardness, or a viscous resin paste having high consistency.

In addition, in the present specification, "binding" a member A and a member B "so as to allow heat transfer therebetween" includes bringing the member A and the member B, which are separate members, into thermal contact with each other as described above; and molding the member A and the member B integrally with each other.

[Overall Configuration of Optical Communication Device]

Figure 2:
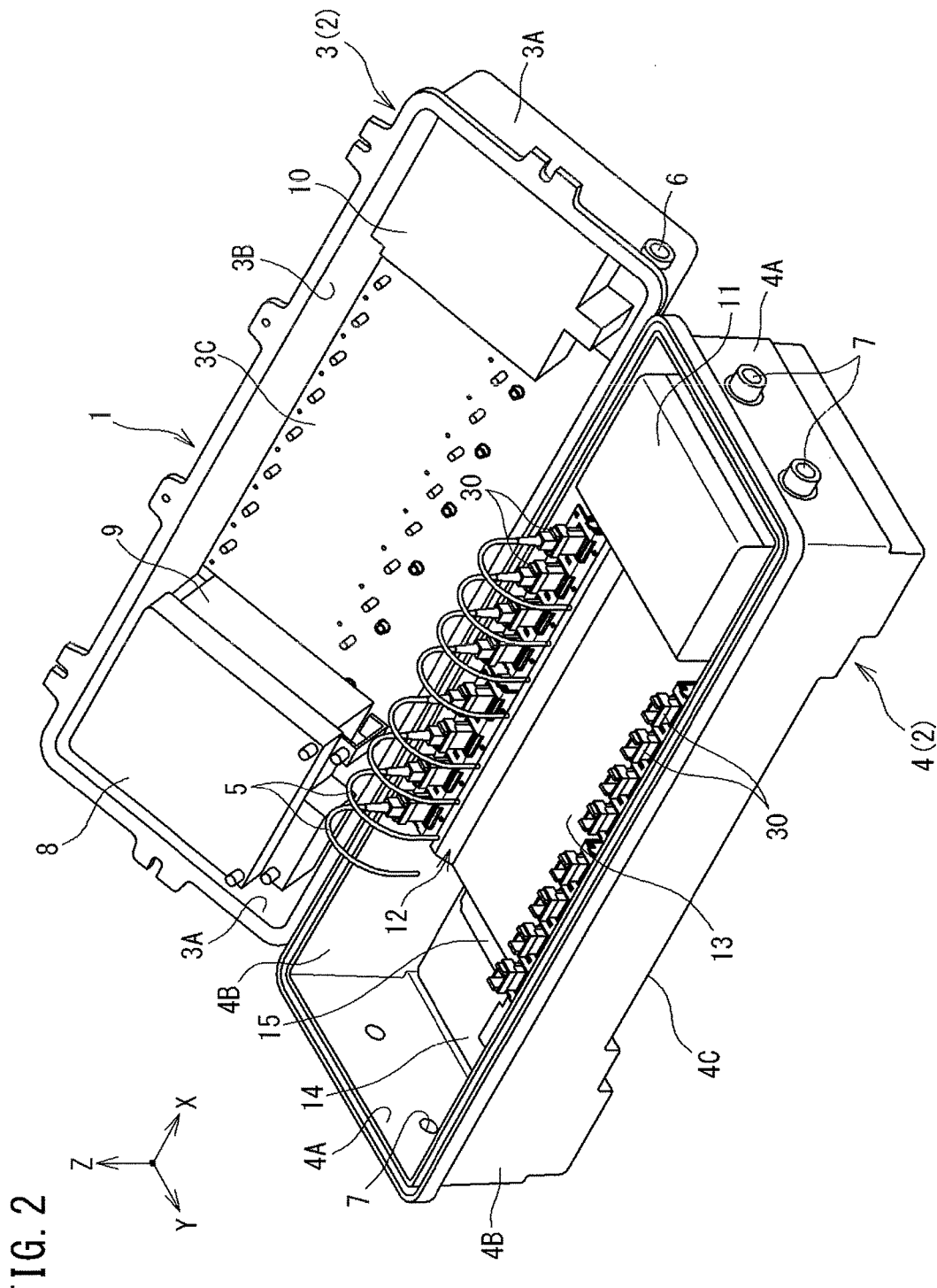
FIG. 2 is a perspective view showing an opened state of the optical communication device.

FIG. 1 is a perspective view of an optical communication device 1 according to an embodiment of the present invention. FIG. 2 is a perspective view showing an opened state of the optical communication device 1.

The optical communication device 1 of the present embodiment is, for example, a 10G-EPON relay, and is a relay compatible with WDM (wavelength division multiplexing)-PON (passive optical network).

Thus, the optical communication device 1 of the present embodiment is installed at a predetermined relay location between an OLT (optical line terminal) and an ONU (optical network unit) forming a PON.

The optical communication device 1 of the present embodiment has eight trunk ports to be used in optical communication with the OLT side, and eight PON ports to be used in optical communication with the ONU side, and a total of 16 (=8×2) optical transceivers 30 (see FIG. 4) are accommodated in a casing 2. It is sufficient that two or more optical transceivers 30 are accommodated in the casing 2, and the number of the optical transceivers 30 is not limited to 16.

In a PON, usually, the OLT is installed in a facility of a communication company, and the ONU is installed in the house of a subscriber. In contrast to this, the relay is often installed in a predetermined outdoor place, such as an upper end portion of an outdoor telephone pole, where severe temperature resistance, waterproof performance, and the like are required.

Thus, in the optical communication device 1 of the present embodiment, a sealed-type casing 2 which blocks the inside thereof from outside air is adopted, and a fan-less-type heat dissipation device 12 (see FIG. 3) which dissipates heat through the thermal route of optical transceiver 30→heat sink 20 (see FIG. 3)→casing 2 is adopted. It should be noted that the optical communication device 1 may be installed inside a small-scale building at a predetermined relay location.

As shown in FIG. 1, the optical communication device 1 includes the casing 2 having a substantially rectangular parallelepiped shape. In the following, the longitudinal direction of the casing 2 is defined as "X direction", the width direction of the casing 2 is defined as "Y direction", and the vertical direction (up-down direction) of the casing 2 is defined as "Z direction".

The casing 2 has an upper housing 3 and a lower housing 4 which are each open at one side in the up-down direction. The open edges of the respective housings 3, 4 are joined with each other through a rubber packing not shown, or the like. Accordingly, the inside of the casing 2 is blocked from the outside air.

The upper housing 3 integrally has: a pair of side walls 3A respectively located at the ends in the longitudinal direction; a pair of side walls 3B respectively located at the ends in the width direction; and a top plate 3C having a substantially rectangular shape in a plane view.

The lower housing 4 integrally has: a pair of side walls 4A respectively located at the ends in the longitudinal direction; a pair of side walls 4B respectively located at the ends in the width direction; and a bottom plate 4C having a substantially rectangular shape in a plane view.

In the side walls 3A, 4A of the respective housings 3, 4, an insertion hole 6 for a power supply cable (not shown) and insertion holes 7 for optical fibers 5 (see FIG. 2) are formed, respectively.

As shown in FIG. 2, a fiber manager 8, power supply units 9, 10, an MUX/DMUX 11, the heat dissipation device 12 for the optical transceivers 30, a fiber tray 13, a base plate 14, a main board 15, and the like are accommodated in the casing 2.

The fiber manager 8 and the power supply unit 9 are disposed at one side in the longitudinal direction of the upper housing 3, and the power supply unit 10 is disposed at the other side in the longitudinal direction of the upper housing 3. The MUX/DMUX 11 is disposed at the other side in the longitudinal direction of the lower housing 4.

The fiber tray 13 is disposed in a center portion in the longitudinal direction of the lower housing 4, and is fixed at the upper edges of a plurality of pressing beams 21 (see FIG. 3) described later. The base plate 14 is formed of a metal plate having a rectangular shape a little smaller than the open edge of the lower housing 4, and is horizontally fixed to the bottom plate 4C of the lower housing 4. The main board 15 includes a rigid printed circuit board, has a length in the longitudinal direction thereof shorter than that of the base plate 14, and is fixed in a laminated state to a center portion in the longitudinal direction of the base plate 14.

[Configuration of Heat Dissipation Device for Optical Transceiver]

Figure 3:
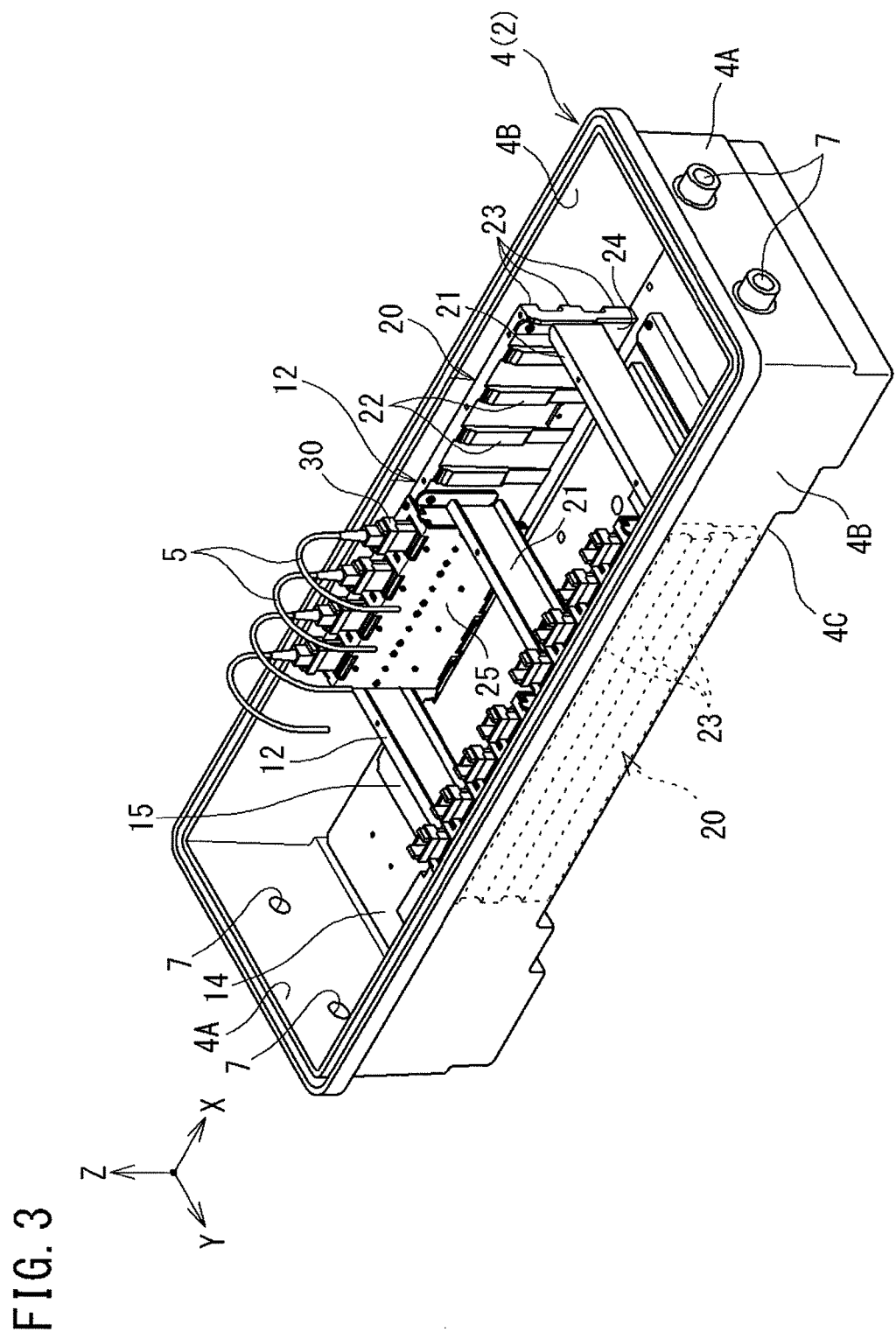
FIG. 3 is a perspective view showing an internal structure of a lower housing of the optical communication device.

FIG. 3 is a perspective view showing an internal structure of the lower housing 4 of the optical communication device 1. Specifically, FIG. 3 is a perspective view of the lower housing 4 shown in FIG. 2, with the fiber tray 13, the MUX/DMUX 11, and some of holding units 25 (see FIG. 5), and the like removed therefrom.

As shown in FIG. 3, the heat dissipation device 12 of the present embodiment includes: a pair of heat sinks 20 respectively in thermal contact with the inner surfaces of both side walls 4B of the lower housing 4; and a plurality of pressing beams 21 pressing the pair of the heat sinks 20 against the inner surfaces of the side walls 4B, respectively.

Each heat sink 20 is implemented as a member separated from the casing 2, and is formed of a thermal conduction member made of an alloy that contains a metal such as aluminum, iron, or copper having good heat transfer property. The thermal conduction member is formed of a substantially rectangular plate that is long in the X direction.

A plurality of contact portions 22 which respectively correspond to a plurality of optical transceivers 30 are formed in the front face (the face at the inner side in the Y direction) of the heat sink 20. Each contact portion 22 is formed as a vertical rib protruding from the front face of the heat sink 20, and the projected end face of the vertical rib serves as a contact surface having a rectangular shape that is long in the up-down direction.

The heat dissipation device 12 of the present embodiment has a layout in which a half (eight in the shown example) of a predetermined accommodation number (16 in the shown example) of the optical transceivers 30 are brought into thermal contact with one heat sink 20.

Thus, a plurality (eight in the shown example) of the contact portions 22 having an identical shape are arrayed at intervals in the X direction, at the front face of each heat sink 20. A plurality (eight in the shown example) of the optical transceivers 30 are arrayed at positions opposed to the contact portions 22 inside the lower housing 4, by means of a plurality of the holding units 25.

In the rear face (the face at the outer side in the Y direction) of each heat sink 20, a plurality (three in the shown example) of heat transfer portions 23 which are in thermal contact with a corresponding side wall 4B of the lower housing 4 are formed. Each heat transfer portion 23 is formed as a horizontal rib protruding from the rear face of the heat sink 20, and the projected end face of the horizontal rib serves as a contact surface having a rectangular shape that is long in the X direction.

A tapered surface 24 which is slightly inclined inwardly in the Y direction toward the lower side thereof is formed at the front face of the heat sink 20. The tapered surface 24 is formed at three positions in total, i.e., end portions and a center portion in the longitudinal direction (the X direction) of the heat sink 20 (see FIG. 7).

The pair of the heat sinks 20 are set inside the lower housing 4, in a state where the heat transfer portions 23 at the rear face side of the heat sinks 20 are in contact with the inner surfaces of the side walls 4B.

In this state, a plurality (three in the shown example) of the pressing beams 21 are pushed into the space between the tapered surfaces 24 of the pair of the heat sinks 20. As a result, the pair of the heat sinks 20 are respectively pressed outwardly in the Y direction by both ends of each pressing beam 21, whereby the heat transfer portions 23 of each heat sink 20 is pressed against the inner surface of the corresponding side wall 4B.

Thus, the plurality of the pressing beams 21 press the heat sinks 20 against the inner surfaces of the side walls 4B of the lower housing 4, thereby functioning as a pressing member which brings the heat transfer portions 23 at the rear face side of each heat sink 20 into thermal contact with the inner surface of the corresponding side wall 4B.

The heat dissipation device 12 of the present embodiment further includes the holding unit 25 each of which holds a plurality of cage members 35 (see FIG. 4) inside the lower housing 4 to position the plurality of cage members 35 with respect to the heat sink 20. The configuration of the holding unit 25 will be described later.

[Configuration of Optical Transceiver and Cage Member]

Figure 4:
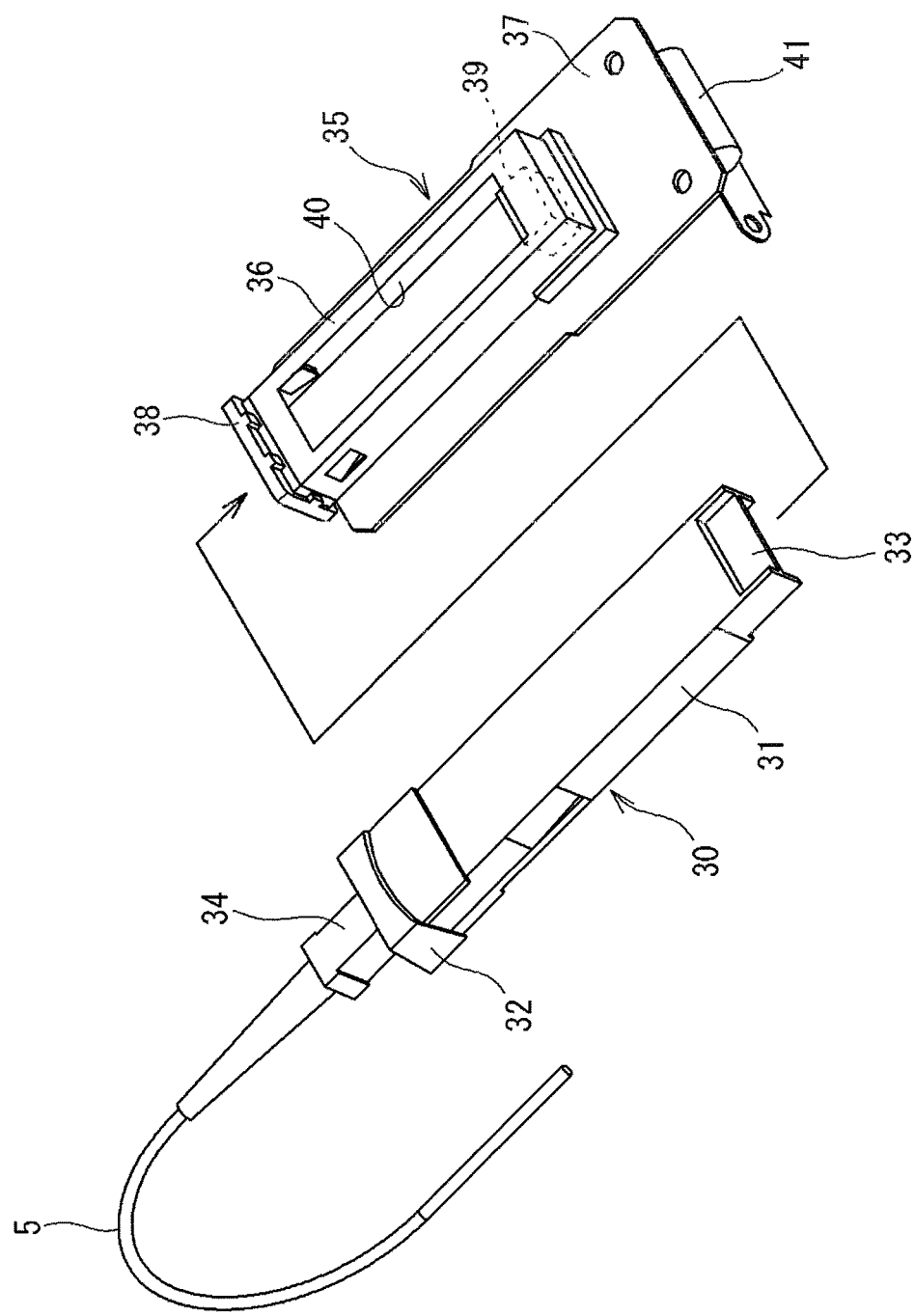
FIG. 4 is a perspective view of an optical transceiver and a cage member.

FIG. 4 is a perspective view of the optical transceiver 30 and the cage member 35.

As shown in FIG. 4, the optical transceiver 30 of the present embodiment is an XFP-type pluggable optical transceiver, for example. The optical transceiver 30 includes: a body portion 31 formed as a metal hollow case having a substantially rectangular parallelepiped shape; and a socket portion 32 mounted to one end side in the longitudinal direction of the body portion 31.

A circuit board having electronic components such as a light emitting element and a light receiving element mounted thereto is accommodated in the body portion 31. A plug 33 to be electrically connected to a connector 39 of the cage member 35 is provided at the other end side in the longitudinal direction of the body portion 31.

An optical connector 34 provided at the end of the optical fiber 5 can be detachably connected to the socket portion 32. A receptacle (not shown) corresponding to the optical connector 34 is accommodated in the socket portion 32.

The cage member 35 includes: a cage 36 configured to accommodate one optical transceiver 30; and a host board 37 having the single cage 36 mounted to a surface thereof.

The cage 36 is formed as a metal hollow case having a substantially rectangular parallelepiped shape. An insertion hole 38 is provided at one end side in the longitudinal direction of the cage 36. The cross-sectional shapes of the inner peripheral surfaces of the cage 36 and the insertion hole 38 are slightly greater than the cross-sectional shape of the outer peripheral surface of the body portion 31. Therefore, the body portion 31 of the optical transceiver 30 can be inserted into/pulled out of the cage 36 along the longitudinal direction thereof.

The host board 37 is implemented as a rigid printed circuit board, and the connector 39 is provided at the surface thereof. The connector 39 is disposed at the depth side in the cage 36.

Thus, when the body portion 31 of the optical transceiver 30 is inserted into the cage 36 through the insertion hole 38, the plug 33 of the optical transceiver 30 is connected to the connector 39 of the host board 37. As a result, transmission/reception of a communication signal is established between the optical transceiver 30 and the host board 37, whereby power supply to the optical transceiver 30 is performed.

An opening 40 which allows the body portion 31 of the optical transceiver 30 accommodated in the cage 36 to be partially exposed is formed in a wall portion, at the opposite side to the host board 37, of the cage 36. The shape of the opening 40 is a rectangle that is a little larger than that of the contact surface of the contact portion 22 of the heat sink 20.

A flat, flexible cable 41 is connected to the other end in the longitudinal direction of the host board 37. It should be noted that the flexible cable 41 may not be necessarily of a flat type, and may be a wire cable.

[Configuration of Holding Unit]

Figure 5:
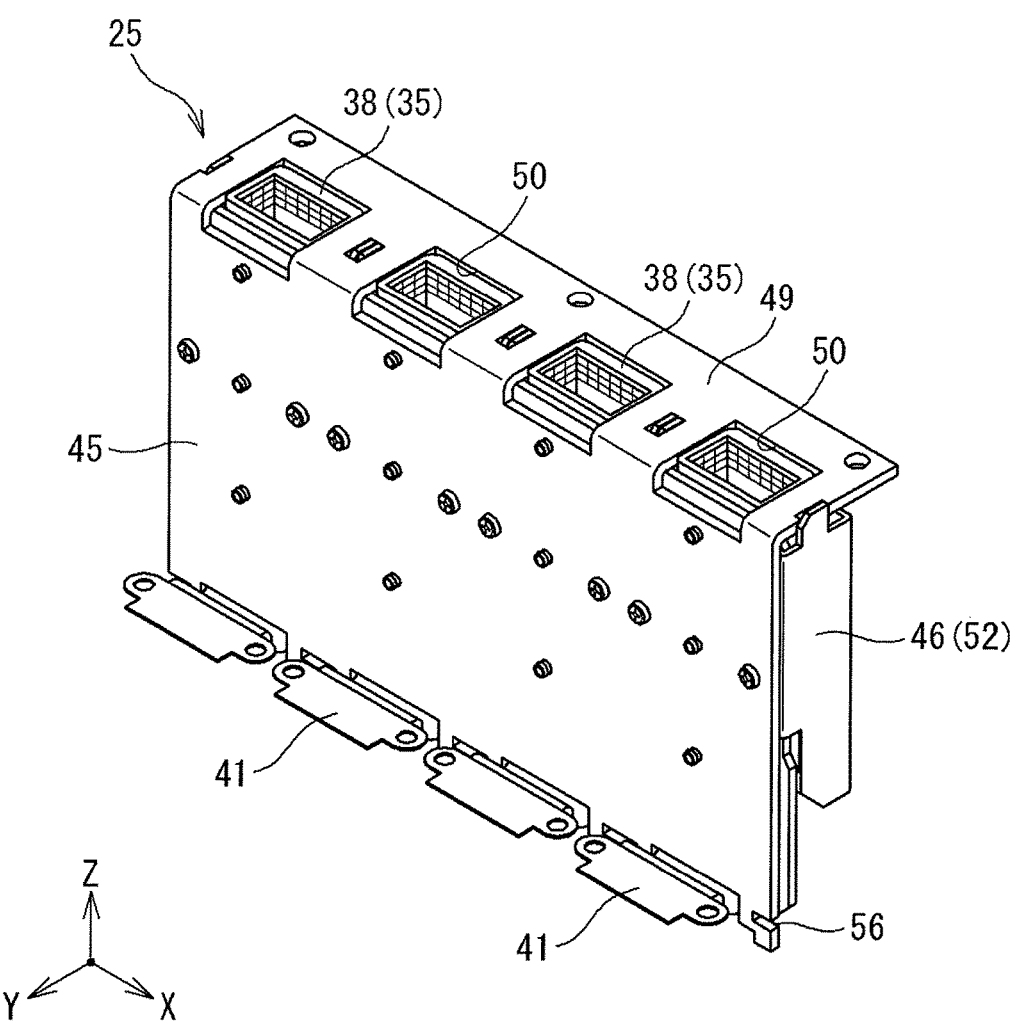
FIG. 5 is a perspective view of a holding unit of a heat dissipation device viewed from a front face side thereof.
Figure 6:
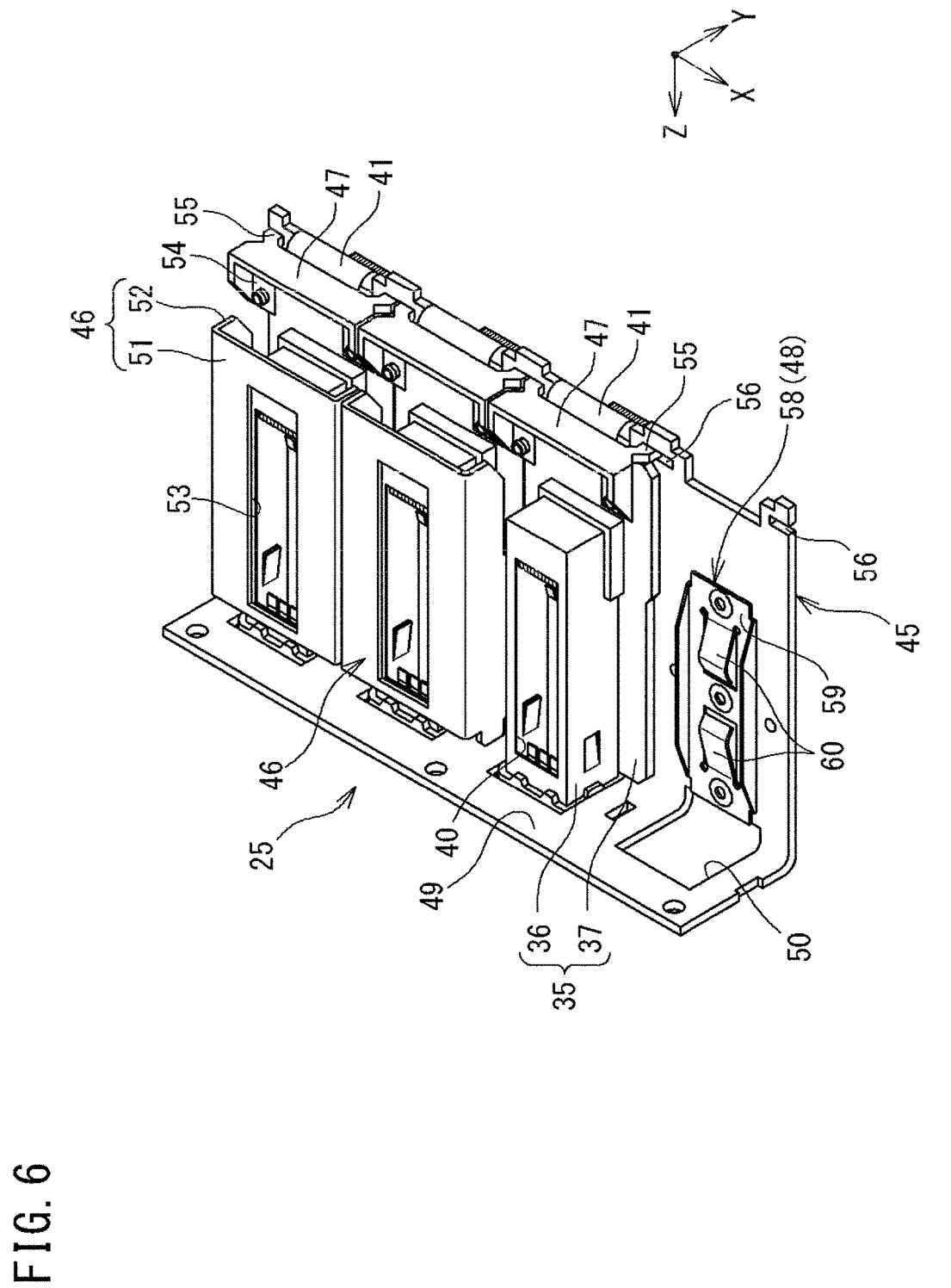
FIG. 6 is a perspective view of the holding unit of the heat dissipation device viewed from a rear face side thereof.
Figure 7:
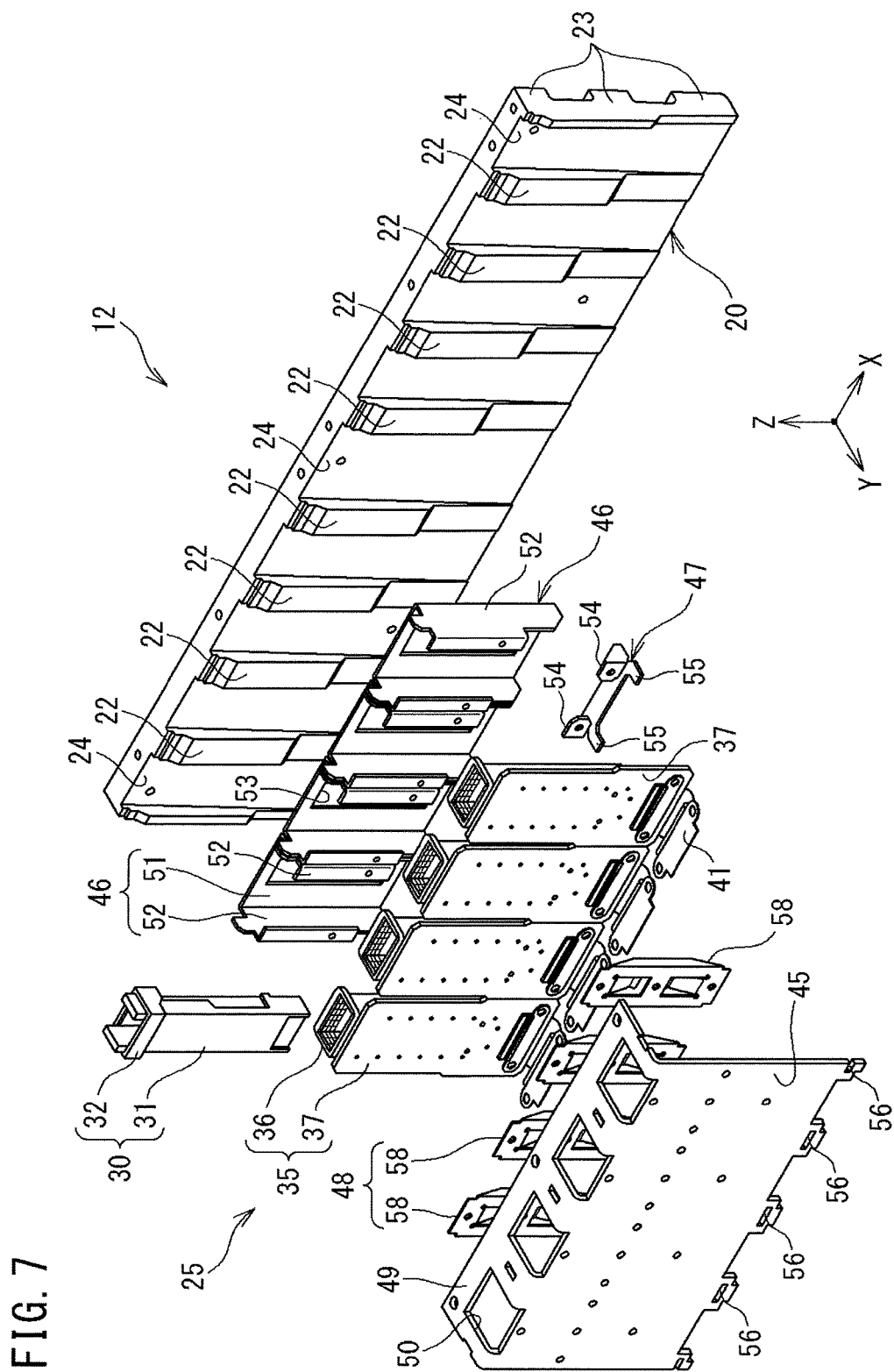
FIG. 7 is an exploded perspective view of the heat dissipation device.

FIG. 5 is a perspective view of the holding unit 25 of the heat dissipation device 12 viewed from the front face side thereof. FIG. 6 is a perspective view of the holding unit 25 of the heat dissipation device 12 viewed from the rear face side thereof. FIG. 7 is an exploded perspective view of the heat dissipation device 12.

In the following, with reference to these figures, a configuration of the holding unit 25 which is one of the components of the heat dissipation device 12 is described.

The holding unit 25 of the present embodiment is an assembly of parts which hold a plurality (four in the shown example) of the cage members 35 inside the casing 2. The holding unit 25 includes a holding plate 45, positioning members 46, 47, and an elastic member 48.

The holding plate 45 is formed of a substantially L-shaped steel plate member having a flange portion 49 formed in a bent manner at the upper end thereof. A plurality (four in the shown example) of insertion windows 50 respectively corresponding to the insertion holes 38 of the cage members 35 are formed in the flange portion 49.

The holding plate 45 is mounted inside the lower housing 4, by the leading edge of the flange portion 49 being screwed to the upper edge of the heat sink 20, and by the lower edge of the holding plate 45 being fitted in a slit 14A (see FIG. 8) in the base plate 14.

At this time, the width direction of the holding plate 45 is aligned with the arraying direction (the X direction) of the contact portions 22, and the interval D (see FIG. 8) between the inner surface of the holding plate 45 and each of the contact portions 22 is identical. In addition, the insertion windows 50 are disposed at positions, in the X direction, that correspond to the contact portions 22, respectively.

Each positioning member 46 is implemented as a metal fitting obtained by bending a steel plate member into a predetermined shape as shown in the drawing. The positioning member 46 includes: a covering plate portion 51 having a substantially rectangular shape; and a pair of left and right mounting plate portions 52 which extend in the thickness direction (the Y direction) from both ends in the width direction of the covering plate portion 51.

The covering plate portion 51 has an opening 53 which is slightly larger than the opening 40 of the cage member 35. The positioning member 46 is mounted to the inner surface of the holding plate 45 with the cage member 35 held therein, by the pair of the mounting plate portions 52 being screwed to the holding plate 45.

Movement in the width direction (the X direction) of the cage member 35 held in the positioning member 46 is restricted as a result of the host board 37 being sandwiched between the pair of the mounting plate portions 52. However, this movement restriction allows a slight play.

The interval in the thickness direction (the Y direction) between the covering plate portion 51 and the holding plate 45 is greater than the dimension in the thickness direction of the cage member 35. Thus, the cage member 35 held in the positioning member 46 is allowed to move in the thickness direction (the Y direction) of the holding plate 45.

Thus, the positioning member 46 has a function of positioning the cage member 35 within the aforementioned interval D (see FIG. 8) such that movement in the width direction (the X direction) of the cage member 35 with respect to the holding plate 45 is restricted, and such that movement in the thickness direction (the Y direction) of the cage member 35 with respect to the holding plate 45 is allowed.

It should be noted that a plurality (four in the shown example) of the positioning members 46 may be integrated with one another, so as to be implemented as one member formed of a resin-molded article, for example.

The positioning member 47 is implemented as a metal fitting obtained by bending a steel plate member into a predetermined shape as shown in the drawing. The positioning member 47 includes: a pair of left and right mounting piece portions 54 to be screwed to the lower edge of the host board 37; and a pair of left and right engagement piece portions 55 to be engaged with the lower edge of the holding plate 45.

When the mounting piece portions 54 are screwed to the lower edge of the host board 37, the engagement piece portions 55 project to the back surface side of the host board 37. The projected engagement piece portions 55 can be fitted in engagement slits 56 formed in a lower end portion of the holding plate 45.

When the engagement piece portions 55 are fitted in the engagement slits 56, the positioning member 47 becomes no longer able to move in the vertical direction (the Z direction), whereby movement in the vertical direction (the Z direction) of the cage member 35 is restricted. However, this movement restriction allows a slight play.

The engagement piece portions 55 are fitted in the engagement slits 56 without being prevented from slipping therefrom. Therefore, also after the engagement piece portions 55 have been fitted in the engagement slits 56, the cage member 35 with the positioning member 47 fixed thereto is allowed to move in the thickness direction (the Y direction) of the holding plate 45.

Thus, the positioning member 47 has a function of positioning the cage member 35 within the aforementioned interval D (see FIG. 8) such that movement in the vertical direction (the Z direction) of the cage member 35 with respect to the holding plate 45 is restricted, and such that movement in the thickness direction (the Y direction) of the cage member 35 with respect to the holding plate 45 is allowed.

It should be noted that a plurality (four in the shown example) of the positioning members 47 may be integrated with one another, so as to be implemented as one member formed of a resin-molded article, for example.

In the shown example, the positioning member 46 and the positioning member 47 are implemented as separate members. However, these members 46, 47 may be implemented as a common member formed of a resin-molded article, for example.

The elastic member 48 of the present embodiment is composed of a plurality (four in the shown example) of metal compression springs 58 respectively interposed between the holding plate 45 and the plurality of the cage members 35.

Each compression spring 58 is implemented as a plate spring obtained by bending a plate formed of a spring steel into a predetermined shape. The compression spring 58 includes: a strip-shaped mounting plate 59; and a pair of upper and lower pressing pieces 60 obtained by cutting and raising parts of the mounting plate 59.

Each compression spring 58 is mounted with the pressing pieces 60 projecting toward the host board 37 side, as a result of the mounting plate 59 being screwed to the inner surface of the holding plate 45.

The compression springs 58 are disposed at intervals, at positions in the X direction that respectively correspond to the insertion windows 50 in the inner surface of the holding plate 45. Therefore, one compression spring 58 corresponds to one cage member 35, and applies pressing force in the Y direction only to one cage member 35.

In the shown example, each compression spring 58 is mounted to the inner surface of the holding plate 45. However, contrariwise, each compression spring 58 may be mounted to the back surface of the host board 37.

Further, although the compression spring 58 formed of a plate spring is shown as an example, the compression spring 58 may adopt a spring member of another form, such as a disc spring or a coil spring.

Still further, although the elastic member 48 composed of a plurality of the compression springs 58 is shown as an example, the elastic member 48 may adopt an elastic member implemented as a common member that applies pressing force to a plurality of the cage members 35 at the same time.

[Mounted State of Heat Dissipation Device]

Figure 8:
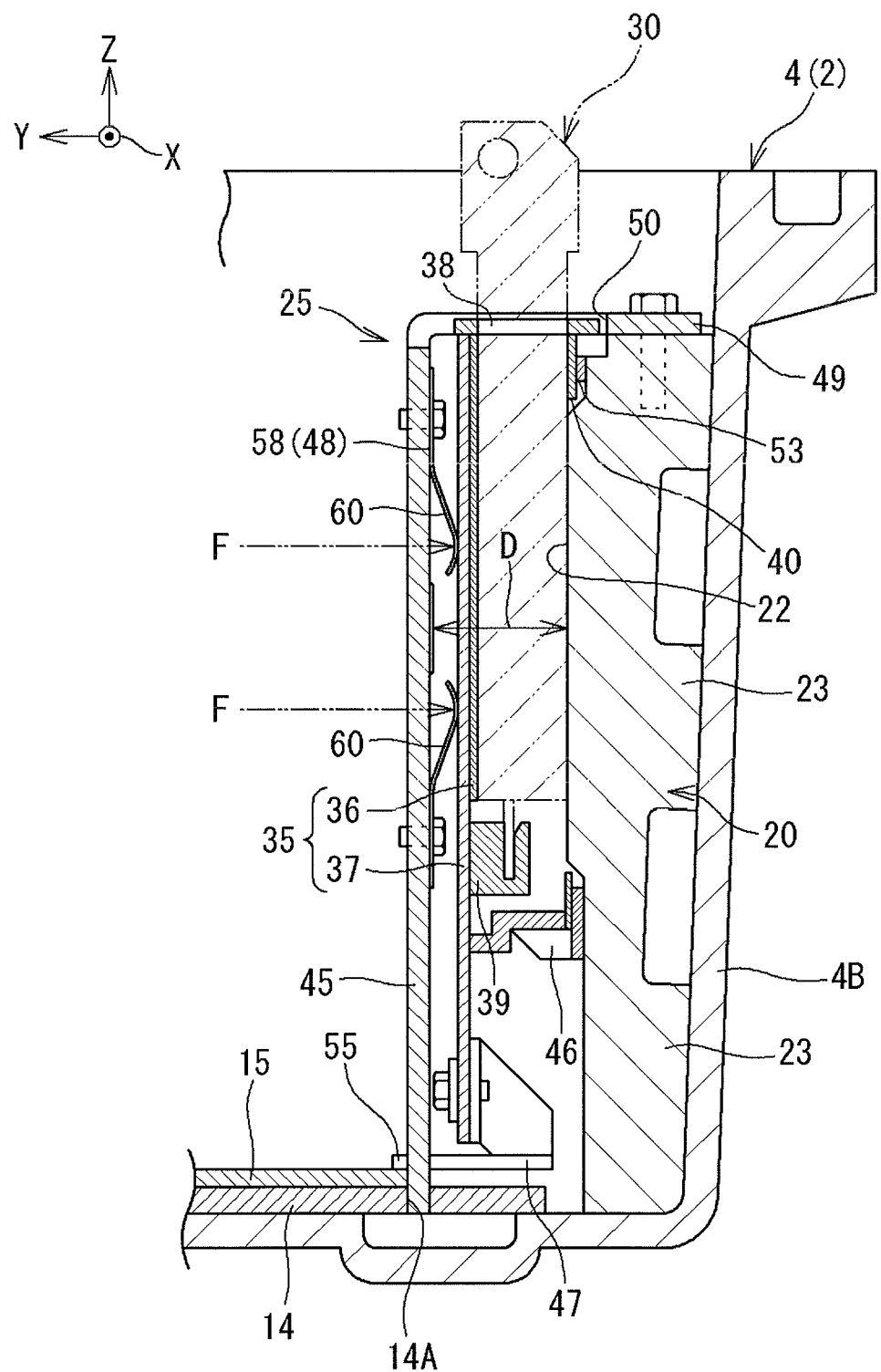
FIG. 8 shows a mounted state of a heat sink and the holding unit in a longitudinal cross section thereof.

FIG. 8 shows a mounted state of the heat dissipation device 12 in a longitudinal cross-section thereof.

As shown in FIG. 8, the heat sink 20 which is a separate member from the casing 2 is mounted inside the lower housing 4 such that the heat transfer portions 23 are in thermal contact with the inner surface of the side wall 4B. The thermal contact of the heat sink 20 to the side wall 4B is achieved by pressing force of the aforementioned pressing beams 21.

After the heat sink 20 is mounted, the holding units 25, shown in FIG. 5, accommodating the cage members 35 are mounted inside the lower housing 4.

Mounting of each holding unit 25 is performed by screwing the flange portion 49 of the holding plate 45 to the upper end surface of the heat sink 20 and fitting the lower edge of the holding plate 45 into the slit 14A of the base plate 14.

At this time, the opening 40 of the cage member 35 and the opening 53 of the positioning member 46 are each set at a position that corresponds to the contact portion 22 of the heat sink 20. In addition, the interval D between the inner surface of the holding plate 45 and each of the contact portions 22 is identical.

Next, into each cage member 35 accommodated in the holding unit 25, an optical transceiver 30 is inserted from above. Then, the pressing pieces 60 of the compression spring 58 accommodated in the holding unit 25 undergo compressive deformation, and elastic force F of each deformed pressing piece 60 acts outwardly in the Y direction toward the back surface of the host board 37.

Due to the elastic force F of each pressing piece 60 of the compression spring 58, the body portion 31 of the optical transceiver 30 comes into thermal contact with the contact portion 22, of the heat sink 20, which projects in the openings 40, 53.

[Method for Connecting Main Board and Host Board]

Figure 9:
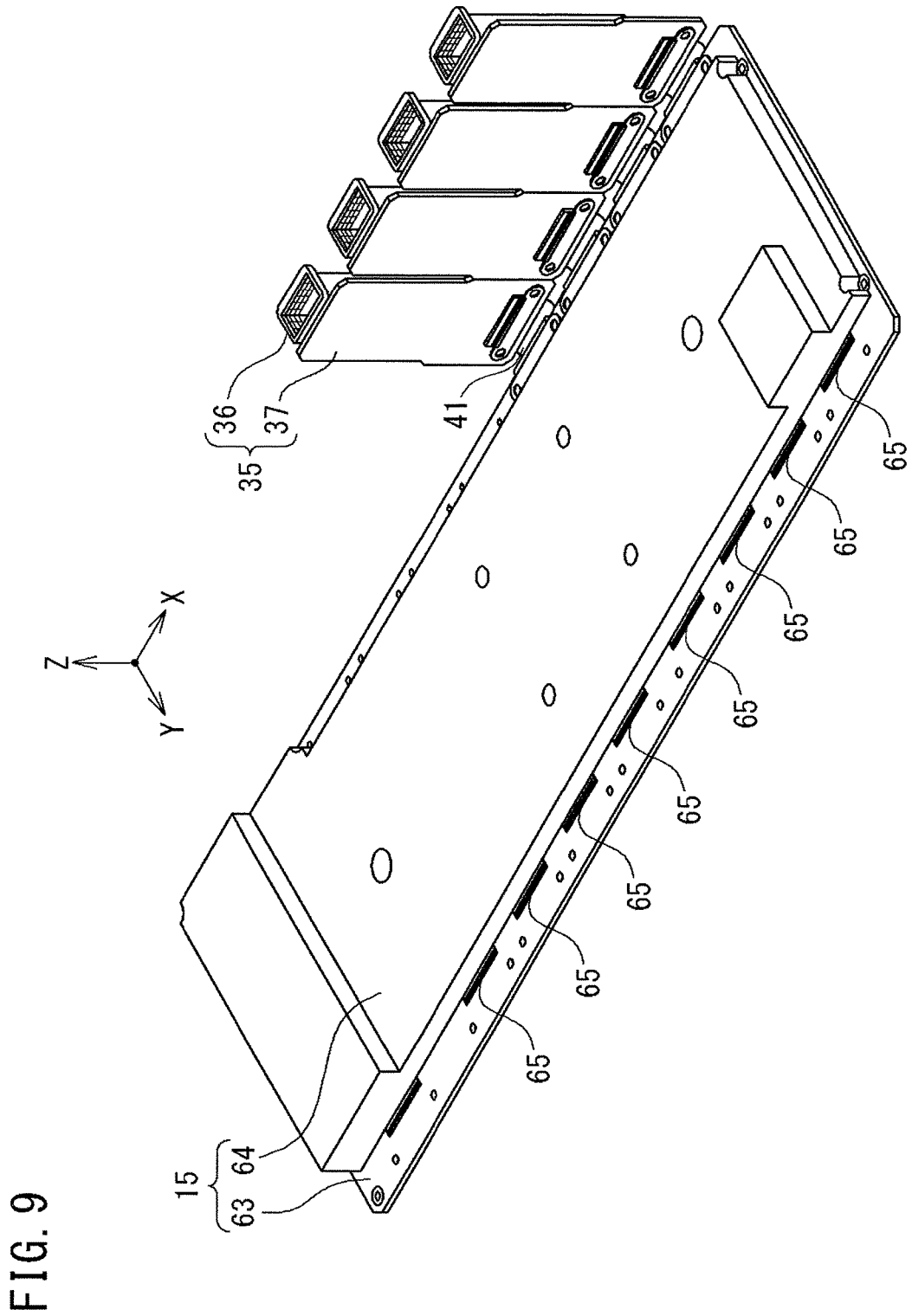
FIG. 9 is a perspective view showing a connected state of a main board and host boards.

FIG. 9 is a perspective view showing a method for connecting the main board 15 and the host boards 37 together.

As shown in FIG. 9, the main board 15 includes a board body 63 implemented as a rigid printed circuit board; and a cover plate 64 which covers the circuit portion of the board body 63 from above. The board body 63 has mounted thereto an electronic circuit including a CPU (central processing unit), a memory, and the like, the electronic circuit performing information processing of an electric signal outputted from each optical transceiver 30.

At both edges in the width direction (the Y direction) of the board body 63, connectors 65 to each of which the flexible cable 41 of the host board 37 is detachably connected are provided.

In the present embodiment, at each of the side walls 4B of the lower housing 4, eight cage members 35 are arrayed. Thus, eight connectors 65 are arrayed at intervals in the longitudinal direction (the X direction), at one edge in the width direction of the board body 63, and eight connectors 65 are arrayed at intervals in the longitudinal direction (the X direction), also at the other edge in the width direction of the board body 63.

FIG. 10(a) is a rear view of a plurality (four in the shown example) of the host boards 37 and a plurality of non-branched-type flexible cables 41 connected thereto.

Each non-branched-type flexible cable 41 includes: one first connector 41A to be connected to the board body 63 of the main board 15; and one second connector 41B to be connected to the host board 37.

FIG. 10(a) is a rear view of a plurality (four in the shown example) of the host boards 37 and one branched-type flexible cable 42 connected thereto.

The branched-type flexible cable 42 includes: one first connector 42A to be connected to the board body 63 of the main board 15; and a plurality of second connectors 42B to be connected to the host boards 37. It should be noted that also the branched-type flexible cable 42 may not be necessarily of a flat type, and may be a wire cable.

Effect of the Present Embodiment

Figure 11:
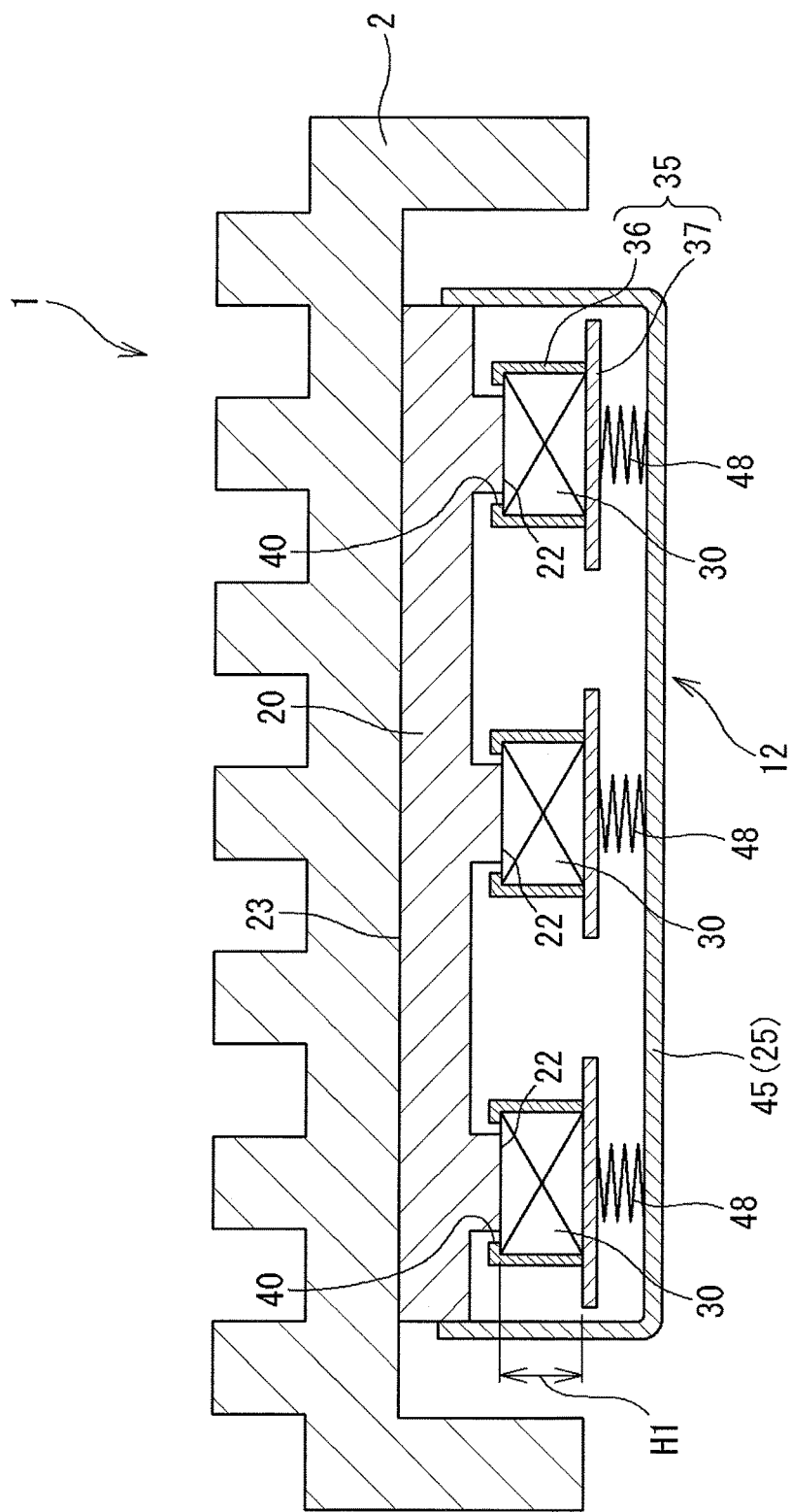
FIG. 11 is a schematic diagram of the heat dissipation device according to the embodiment of the present invention.

FIG. 11 is a schematic diagram of the heat dissipation device 12 according to the embodiment of the present invention.

As shown in FIG. 11, according to the present embodiment, the elastic member 48 presses a plurality of the cage members 35 held in holding unit 25 toward the heat sink 20 side, respectively, whereby the plurality of the optical transceivers 30 are brought into thermal contact with a plurality of the contact portions 22 formed in the heat sink 20.

Thus, in the present embodiment, since the heat sink 20 and the optical transceivers 30 are brought into contact with each other in the one-to-many correspondence mode, the difference in the height H1 in cross section of the optical transceivers 30 does not affect the heat transfer performance from the heat transfer portions 23 of the heat sink 20 toward the casing 2 side.

That is, even if there is a difference in the height H1 in cross section of the optical transceivers 30, the heat transfer portions 23 of the heat sink 20 can be appropriately brought into contact with the casing 2. Thus, in the optical communication device 1 having the casing 2 accommodating the plurality of the optical transceivers 30, the difference between the ambient temperature of the casing 2 and the operating temperature of the optical transceivers 30 in the casing 2 can be reduced.

In the present embodiment, the holding unit 25 having the holding plate 45 and the positioning members 46, 47 is adopted, and the metal compression spring 58 interposed between the holding plate 45 and each cage member 35 is adopted as the elastic member 48 (see FIG. 8).

Thus, compared with a case where a resin elastic member formed of a sponge, a rubber plate, or the like, aged deterioration of the elastic member can be suppressed, and the function of pressing the cage member 35 exhibited by the elastic member can be ensured for a long time.

According to the present embodiment, the pressing beams (pressing member) 21 are provided which bring the heat transfer portions 23 into thermal contact with the inner surface of the casing 2, by pressing the heat sink 20, which is a separate member from the casing 2, against the inner surface of the casing 2.

Accordingly, the heat transfer portions 23 are brought into thermal contact with the inner surface of the casing 2 due to the pressing force by the pressing beams 21, and thus, compared with a case where the heat transfer portions 23 are brought into contact with the inner surface of the casing 2 without application of the pressing force, the heat transfer performance from the heat transfer portions 23 to the casing 2 side can be improved.

Figure 12:
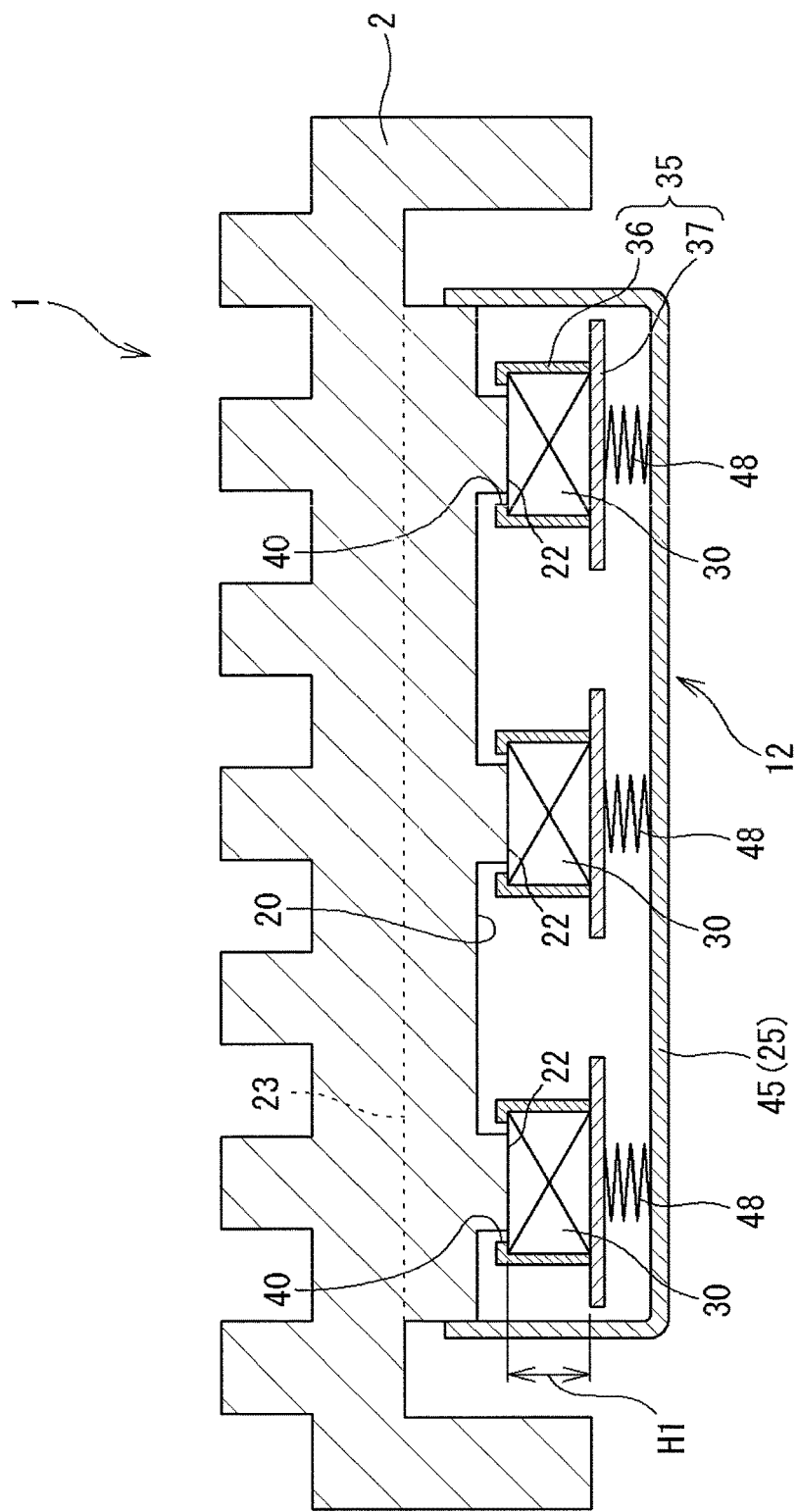
FIG. 12 is a schematic diagram of a heat dissipation device according to a modification.
Figure 13:
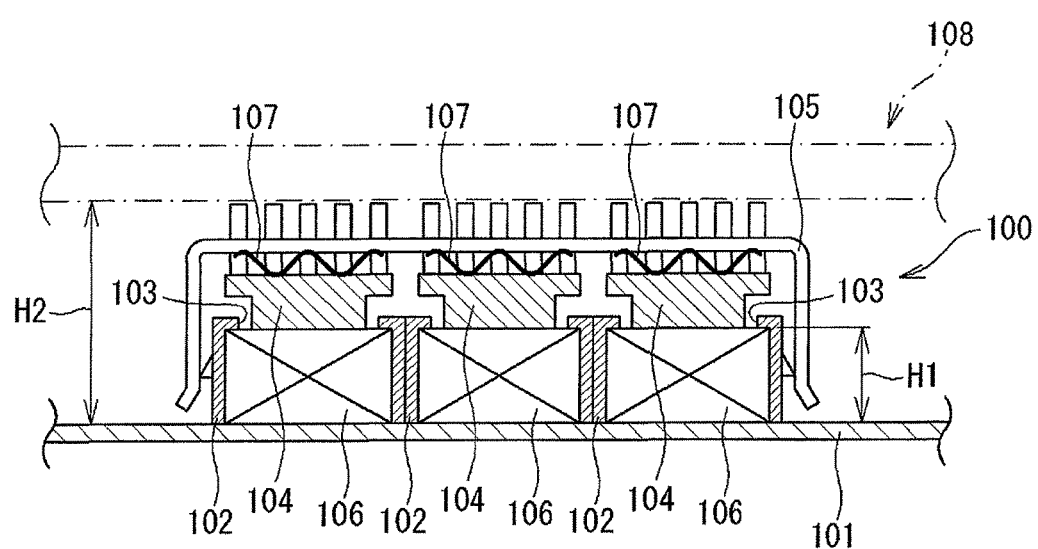
FIG. 13 is a schematic diagram of a conventional heat dissipation device.

FIG. 12 is a schematic diagram of the heat dissipation device 12 according to a modification.

In the heat dissipation device 12 shown in FIG. 12, the heat sink 20 is formed as a member in which the heat sink 20 is molded integrally with the casing 2 such that the heat sink 20 projects from the inner surface of the casing 2.

In this case, the heat transfer portions 23 of the heat sink 20 is formed as a portion made of the material identical to that of the casing 2, without any boundary surfaces between the heat transfer portions 23 and the casing 2. Thus, compared with a case shown in FIG. 11 where the heat sink 20 formed as a separate member is brought into contact with the inner surface of the casing 2, the heat transfer performance from the heat sink 20 to the casing 2 side can be improved.

According to the present embodiment, the host board 37 is connected to the main board 15 by the flexible cable 41, 42 (see FIG. 10) having the first connector 41A, 42A connected to the main board 15, and the second connector 41B, 42B connected to the host board 37.

Thus, for example, as in the case shown in FIG. 9 where the main board 15 is disposed horizontally and the host boards 37 of the cage members 35 are disposed vertically, the present invention is advantageous in that arrangement of the cage members 35 can be substantially freely designed regardless of the main board 15.

Therefore, for example, as in the case shown in FIG. 3 where the main board 15 is disposed at the bottom side in the casing 2 and the holding units 25 holding the cage members 35 are disposed at side portions in the casing 2, the holding units 25 can be disposed in a compact manner at a place where the holding units 25 are less likely to be obstructions in the casing 2, and thus, the accommodation space in the casing 2 can be effectively utilized.

Figure 10:
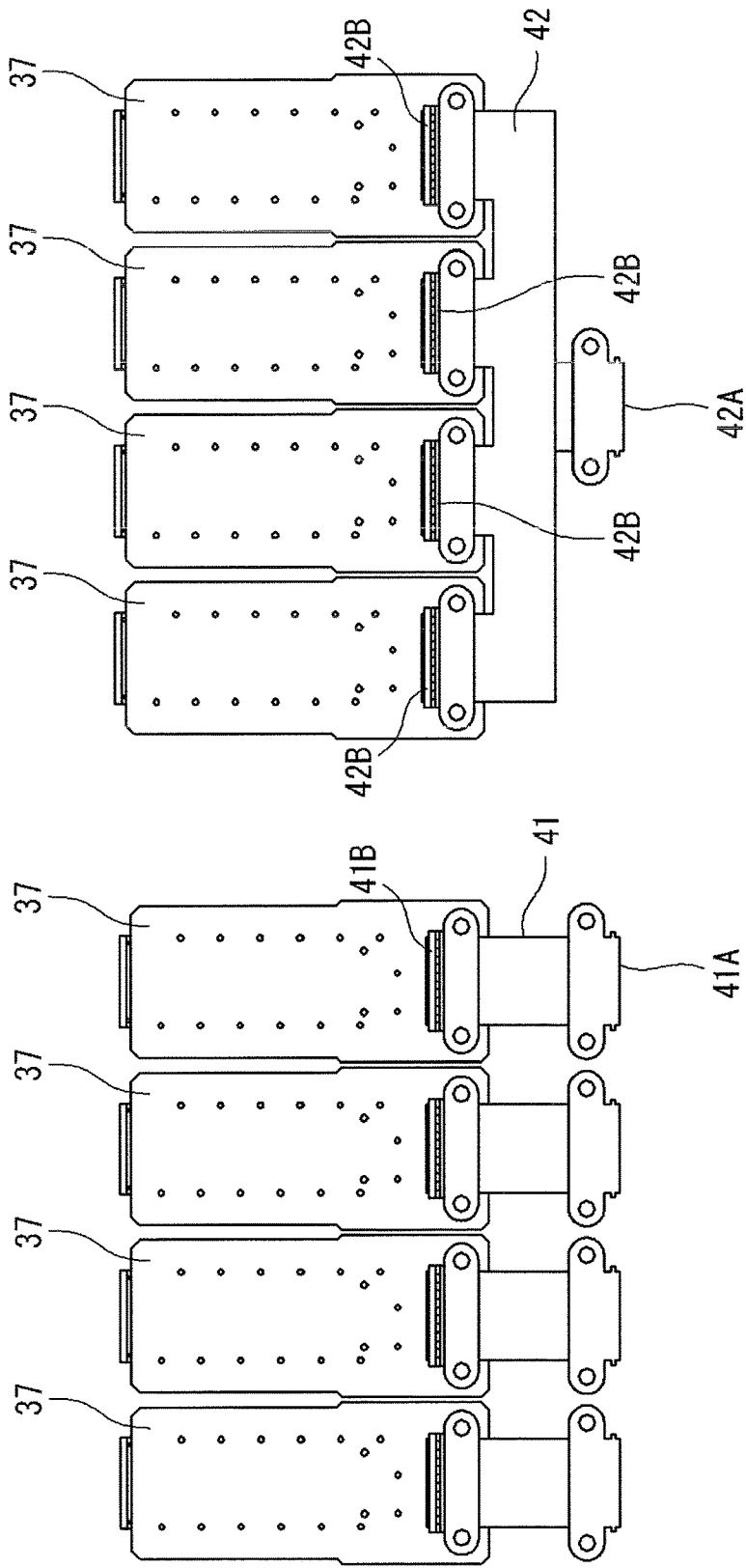
FIG. 10(a) is a rear view of a plurality of the host boards and a plurality of non-branched-type flexible cables connected thereto.
FIG. 10(b) is a rear view of a plurality of the host boards and one branched-type flexible cable connected thereto.

In the present embodiment, if the branched-type flexible cable 42 (see (b) of FIG. 10) which has one first connector 42A and a plurality of second connectors 42B is adopted, the host boards 37 of a plurality of cage members 35 can be wired to the main board 15 simply by connecting the single first connector 42A to the main board 15. Thus, the present invention is advantageous in that wiring work of the cage members 35 is facilitated.

Meanwhile, the temperature condition for a 10G-EPON relay is specified as a range of −40° C. to 60° C. in outside air temperature. In contrast to this, the operating temperature of the optical transceiver 30 is in a range of 0° C. to 70° C.

When the upper limit of the temperature range is focused, even when the outside air temperature is 60° C., the operating temperature of the optical transceiver 30 needs to be at 70° C. or lower. Thus, the temperature difference ΔT between the operating temperature of the optical transceiver 30 and the outside air temperature needs to be suppressed within 10° C.

In this regard, according to the optical communication device 1 of the present embodiment, heat generated from the plurality of the optical transceivers 30 is dissipated to the outside of the casing 2 through the thermal route of: the plurality of the optical transceivers 30→the heat sinks 20→the casing 2. Therefore, even in the case of a fan-less-type, the temperature difference ΔT can be suppressed to be 10° C. or less.

Therefore, the optical communication device 1 of the present embodiment can be suitably used even in a case of a relatively severe temperature condition (a range of −40° C. to 60° C. in outside air temperature) that is required for a 10G-EPON relay.

In order to ensure operation of the optical transceiver 30 at the time when the outside air temperature is lower than 0° C., a heater that operates depending on the magnitude of the outside air temperature is preferably provided inside the casing 2.

Specifically, it is sufficient to install, inside the casing 2, a heater that is activated to heat the optical transceiver 30 when the measurement value of a temperature sensor measuring the outside air temperature becomes lower than 0° C., and that is turned off to stop heating when the measurement value of the temperature sensor exceeds a predetermined value of not lower than 0° C.

Other Modification

The embodiments disclosed herein are all illustrative and not restrictive. The scope of the present invention is not limited to the embodiments described above, and includes all changes which come within the range of equivalency of configuration described in the claims.

For example, the heat dissipation device 12 of the present embodiment can be mounted not only in a PON relay, but also in another optical communication device 1, such as for OLT or ONU.

REFERENCE SIGNS LIST 1 optical communication device
2 casing
3 upper housing
3A side wall
3B side wall
3C top plate
4 lower housing
4A side wall
4B side wall
4C bottom plate
5 optical fiber
6 insertion hole
7 insertion hole
8 fiber manager
9 power supply unit
10 power supply unit
11 MUX/DMUX
12 heat dissipation device
13 fiber tray
14 base plate
14A slit
15 main board
16 main board
20 heat sink
21 pressing beam (pressing member)
22 contact portion
23 heat transfer portion
24 tapered surface
25 holding unit
30 optical transceiver
31 body portion
32 socket portion
33 plug
34 optical connector
35 cage member
36 cage
37 host board
38 insertion hole
39 connector
40 opening
41 flexible cable
41A first connector
41B second connector
42 flexible cable
42A first connector
42B second connector
45 holding plate
46 positioning member
47 positioning member
48 elastic member
49 flange portion
50 insertion window
51 covering plate portion
52 mounting plate portion
53 opening
54 mounting piece portion
55 engagement piece portion
56 engagement slit
58 compression spring
59 mounting plate
60 pressing piece
63 board body
64 cover plate
65 connector

The invention claimed is:

1. An optical communication device having a casing accommodating a plurality of optical transceivers, the optical communication device comprising:
   a heat sink integrally having a plurality of contact portions respectively corresponding to the plurality of the optical transceivers, and a heat transfer portion bound to the casing so as to be able to transfer heat to the casing;
   a plurality of cage members configured to respectively accommodate the plurality of the optical transceivers, and having openings so as to allow the optical transceivers to be partially exposed to the contact portion side, respectively;
   a holding unit configured to hold the plurality of the cage members inside the casing in a state where the openings correspond to the contact portions, respectively; and
   an elastic member configured to bring the plurality of the optical transceivers into thermal contact with the plurality of the contact portions, respectively, by pressing each of surfaces of the plurality of the cage members toward the contact portion side, the surfaces being opposite surfaces to the contact portion, wherein
   each cage member includes:
      a single cage configured to accommodate one of the optical transceivers; and
      a host board having the single cage mounted to a surface thereof.

2. The optical communication device according to claim 1, wherein
   the holding unit includes:
      a holding plate provided inside the casing such that a width direction of the holding plate is aligned with an arraying direction of the contact portions and an interval between the holding plate and each of the plurality of the contact portions is identical; and a positioning member configured to position the plurality of the cage members within the interval such that movement of each cage member in a width direction and a vertical direction with respect to the holding plate is restricted, and such that movement of each cage member in a thickness direction with respect to the holding plate is allowed.

3. The optical communication device according to claim 2, wherein
the elastic member is formed of a metal compression spring interposed between the holding plate and each cage member.

4. The optical communication device according to claim 1, wherein
the heat sink is a member separate from the casing, and
the heat transfer portion of the heat sink is formed as a portion to be in thermal contact with an inner surface of the casing.

5. The optical communication device according to claim 4, further comprising
a pressing member configured to bring the heat transfer portion into thermal contact with the inner surface of the casing, by pressing the heat sink against the inner surface of the casing.

6. The optical communication device according to claim 1, wherein
the heat sink is a member integrated with the casing, and
the heat transfer portion of the heat sink is formed as a portion made of a material identical to that of the casing, without any boundary surface between the heat transfer portion and the casing.

7. The optical communication device according to claim 1, further comprising:
a main board including an electronic circuit configured to perform information processing of an electric signal outputted by each optical transceiver; and a flexible cable including a first connector configured to be connected to the main board and a second connector configured to be connected to the host board.

8. The optical communication device according to claim 7, wherein
the flexible cable is formed of a branched-type cable, the branched-type cable having the first connector and a plurality of the second connectors.

9. A heat dissipation device for optical transceivers, the heat dissipation device configured to dissipate heat generated from a plurality of optical transceivers, the heat dissipation device comprising:
a heat sink integrally having a plurality of contact portions respectively corresponding to the plurality of the optical transceivers, and a heat transfer portion bound to a casing of an optical communication device so as to be able to transfer heat to the casing;
a plurality of cage members configured to respectively accommodate the plurality of the optical transceivers, and having openings so as to allow the optical transceivers to be partially exposed to the contact portion side, respectively;
a holding unit configured to hold the plurality of the cage members inside the casing in a state where the openings correspond to the contact portions, respectively; and
an elastic member configured to bring the plurality of the optical transceivers into thermal contact with the plurality of the contact portions, respectively, by pressing each of surfaces of the plurality of the cage members toward the contact portion side, the surfaces being opposite surfaces to the contact portion, wherein
each cage member includes:
a single cage configured to accommodate one of the optical transceivers; and
a host board having the single cage mounted to a surface thereof.

* * * * *